United States Patent [19]
Nakano et al.

[11] Patent Number: 5,693,973
[45] Date of Patent: Dec. 2, 1997

[54] PROTECTION STRUCTURE OF SEMICONDUCTOR INTEGRATED CIRCUIT

[75] Inventors: Fumio Nakano; Katsuhiko Higashino, both of Tokyo, Japan

[73] Assignee: NEC Corporation, Japan

[21] Appl. No.: 552,821

[22] Filed: Nov. 3, 1995

[30] Foreign Application Priority Data

Nov. 22, 1994 [JP] Japan .................................. 6-287751

[51] Int. Cl.[6] ........................... H01L 27/01; H01L 27/12; H01L 31/0392
[52] U.S. Cl. ............................ 257/355; 257/356
[58] Field of Search ........................ 257/355, 356

*Primary Examiner*—Stephen Meier
*Attorney, Agent, or Firm*—Hayes, Soloway, Hennessey, Grossman & Hage, P.C.

[57] ABSTRACT

A semiconductor integrated circuit device is provided which includes a plurality of circuit sections respectively using a plurality of power supply systems. A static electricity protection circuit section is provided on the same chip as the plurality of circuit sections and connected to the plurality of power supply systems. The protection circuit section includes one or more common potential lines to enable current generated as a result of static electricity to flow between the plurality of power supply systems. The protection circuit section includes a plurality of protection elements, each of which is a diode having an orientation determined based upon potentials of two lines to which the diode is to be connected. When the protection circuit includes one common potential line, the common potential line is set to a potential equal to or higher than the highest potential of the power supply systems, or a potential equal to or lower than the lowest potential of the power supply systems.

20 Claims, 7 Drawing Sheets

PROTECTION STRUCTURE OF SEMICONDUCTOR INTEGRATED CIRCUIT

BACKGROUND OF THE INVENTION

1. Field of the Invention

The present invention relates to a semiconductor integrated circuit, and more particularly, to a static electricity protection circuit of a semiconductor integrated circuit.

2. Description of Related Art

In a conventional semiconductor integrated circuit, a static electricity protection circuit is generally employed to protect the semiconductor integrated circuit from static electricity. The conventional static electricity protection circuit for one internal circuit 106 is shown in FIG. 2. The static electricity protection circuit typically includes a diode 104 provided between a higher power supply line connected to a higher power supply terminal 111 and a signal line connected to a signal terminal 121 and a diode 105 provided between the signal line and a lower power supply or ground potential (GND) line connected to a lower power supply terminal 131. The cathode of the diode 104 is connected to the higher power supply line and the anode thereof is connected to the signal line. Also, the cathode of the diode 105 is connected to the signal line and the anode thereof is connected to the lower power supply line. The higher power supply line, signal line and lower power supply line are connected to the internal circuit 106.

In operation, when the semiconductor integrated circuit on a chip 200 operates in a normal state, since all the diodes 104 and 105 are inversely biased so that they are in a non-conductive state, there is no problem. In a case where a voltage is generated between the higher power supply terminal 111 and the signal terminal 121 due to static electricity, when the potential of signal terminal 121 is higher than that of higher power supply terminal 111, current flows from the signal terminal 121 to the higher power supply terminal 111 through the diode 104 due to the forward bias direction characteristics of the diode 104, and when the potential of higher power supply terminal 111 is higher than that of signal terminal 121, current flows from the higher power supply terminal 111 to the signal terminal 121 through the diode 104 due to break down phenomena of the diode 104. As a result, the internal circuit 106 can be prevented from being destroyed. On the other hand, when a voltage is generated between the signal terminal 121 and the lower power supply terminal 131 due to static electricity, when the potential of lower power supply terminal 131 is higher than that of signal terminal 121, current flows from the lower power supply terminal 131 to the signal terminal 121 through the diode 105 due to the forward bias direction characteristics of the diode 105, and when the potential of signal terminal 121 is higher than that of lower power supply terminal 131, current flows from the signal terminal 121 to the lower power supply terminal 131 through the diode 105 due to break down phenomena of the diode 105. As a result, the internal circuit 106 can be also prevented from being destroyed. Further, when a voltage is generated between the higher power supply terminal 111 and the lower power supply terminal 131 due to static electricity, when the potential of lower power supply terminal 131 is higher than that of higher power supply terminal 111, current flows from the lower power supply terminal 131 to the higher power supply terminal 111 through the diodes 104 and 105 due to the forward bias direction characteristics of the diodes 104 and 105, and when the potential of higher power supply terminal 111 is higher than that of lower power supply terminal 131, current flows from the higher power supply terminal 111 to the lower power supply terminal 131 through the diodes 104 and 105 due to break down phenomena of the diodes 104 and 105. As a result, the internal circuit 106 can be also prevented from being destroyed.

In a large scale semiconductor integrated circuit including both digital circuits and analog circuits, there is a case wherein a higher power supply terminal and lower power supply terminal are commonly used between the digital circuits and the analog circuits, respectively. In such a case, noise comes into the higher power supply terminal or lower power supply terminal because of common impedance of wirings and bonding wires so that desired characteristics cannot be obtained. For this reason, power supply systems are separately provided for the digital circuits and analog circuits in such a semiconductor integrated circuit. In this case, in order to prevent the electrostatic destruction of the power supply systems, it is necessary to interpose a static electricity protection circuit between every two lines of all the power supply systems, as shown in FIG. 1. Note that the signal line and terminal are omitted for simplification of the figure. In the semiconductor integrated circuit as shown in FIG. 1, as the number of power supply systems is increased, a very huge amount of protection circuits must be interposed. For instance, if the number of power supply system is N, the number of protection circuits required is 2N(N−1). As a result, the large amount of protection circuits occupies a large chip area.

SUMMARY OF THE INVENTION

The present invention has, as an object, to provide a semiconductor integrated circuit device in which the number of static electricity protection circuits can be reduced, so that chip area occupied by the static electricity protection circuits can be also reduced.

Another object of the present invention is to provide a semiconductor integrated circuit device in which a pattern design can be easily performed because of a small amount of static electricity protection circuits.

In order to achieve one aspect of the present invention, a semiconductor integrated circuit device is provided which includes a semiconductor integrated circuit including a plurality of circuit sections using respectively different power supply systems and a static electricity protection circuit. The protection circuit is preferably provided on the same chip as the semiconductor integrated circuit. The protection circuit includes a common potential line and static electricity protection elements provided between the common potential line and each of the plurality of circuit sections.

The power supply system of each of the plurality of circuit sections includes at least two power supply lines, and one of the static electricity protection elements is provided for each of the at least two power supply lines, thereby to enable current due to static electricity to flow between the plurality of circuit sections. Further, each of the plurality of circuit sections includes at least one signal line, and the static electricity protection circuit further includes a static electricity protection element provided between the at least signal line and each of the at least two power supply lines. Each of the static electricity protection elements is a diode having an orientation determined based upon potentials of two lines to which the diode is to be connected, such that current does not flow through the diode without a voltage due to static electricity.

The common potential line is set to a predetermined potential level. For instance, the common potential line is set to a potential equal to or higher than the highest potential of the power supply systems. Alternatively, the common potential line may be set to a potential equal to or lower than the lowest potential of the power supply systems.

In order to achieve another aspect of the present invention, a semiconductor integrated circuit device is provided which includes a semiconductor integrated circuit including a plurality of circuit sections using respectively different power supply systems, and a static electricity protection circuit provided on the same chip as the semiconductor integrated circuit, including two common potential lines and static electricity protection elements provided between the common potential line and each of the plurality of circuit sections and between the common potential lines. In this case, one of the common potential lines is set to a potential equal to or higher than the highest potential of the power supply systems and the other is set to a potential equal to or lower than the lowest potential of the power supply systems.

In order to still another aspect of the present invention, a semiconductor integrated circuit device may be composed of a plurality of power supply systems, and a static electricity protection section connected to the plurality of power supply systems, and enable current due to static electricity to flow between the plurality of power supply systems.

DESCRIPTION OF THE PREFERRED EMBODIMENTS

The static electricity protection circuit of a semiconductor integrated circuit according to the present invention will be described below in detail with reference to the accompanying drawings.

Figure 3:
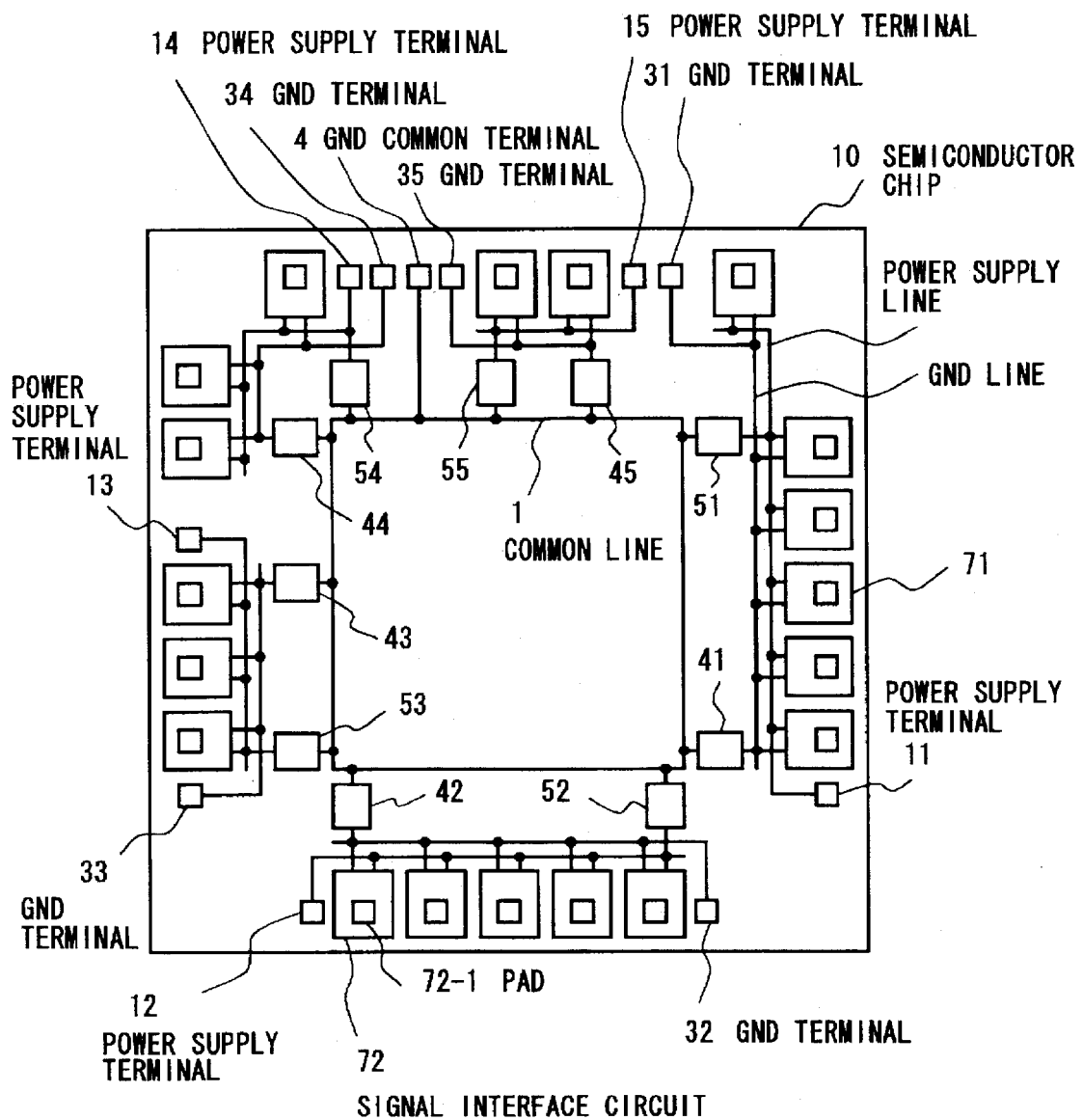
FIG. 3 is a schematic block diagram of a semiconductor integrated circuit according to a first embodiment of the present invention in which a ground common terminal and a ground common line are provided so that the number of static electricity protection circuits is reduced compared to the conventional semiconductor integrated circuit.

First, the static electricity protection circuit according to a first embodiment of the present invention will be described. FIG. 3 is a schematic block diagram of a semiconductor integrated circuit chip 10. Referring to FIG. 3, many internal circuit groups, e.g., five circuit groups in the figure are provided. The internal circuit groups are represented by internal circuits 71, 72, . . . . A power supply system is provided for each of circuit groups. Each power supply system includes a higher power supply terminal 11, 12, 13, 14, or 15 which is connected to a higher power supply line and a lower power supply terminal 31, 32, 33, 34, or 35 which is connected to lower power supply line. The internal circuit groups and the power supply terminals are provided at the inner periphery of the semiconductor chip 10. Further, at the periphery of the semiconductor chip 10 is provided a lower power supply common terminal 4 which is connected to a ground (GND) common line 1 provided in the central portion of the semiconductor chip 10 in a ring manner. The common line 1 is not limited to the ring shape and may have an open portion. The higher power supply lines of the five power supply systems are connected to the common line 1 which is connected to a GND common terminal 4, by the static electricity protection elements 51, 52, 53, 54, and 55 and the lower power supply lines thereof are connected to the common line 1 by the static electricity protection elements 41, 42, 43, 44, and 45. Each of the protection elements includes a diode. Note that a signal line and signal terminal are omitted in the figure for simplification of illustration.

Figure 4:
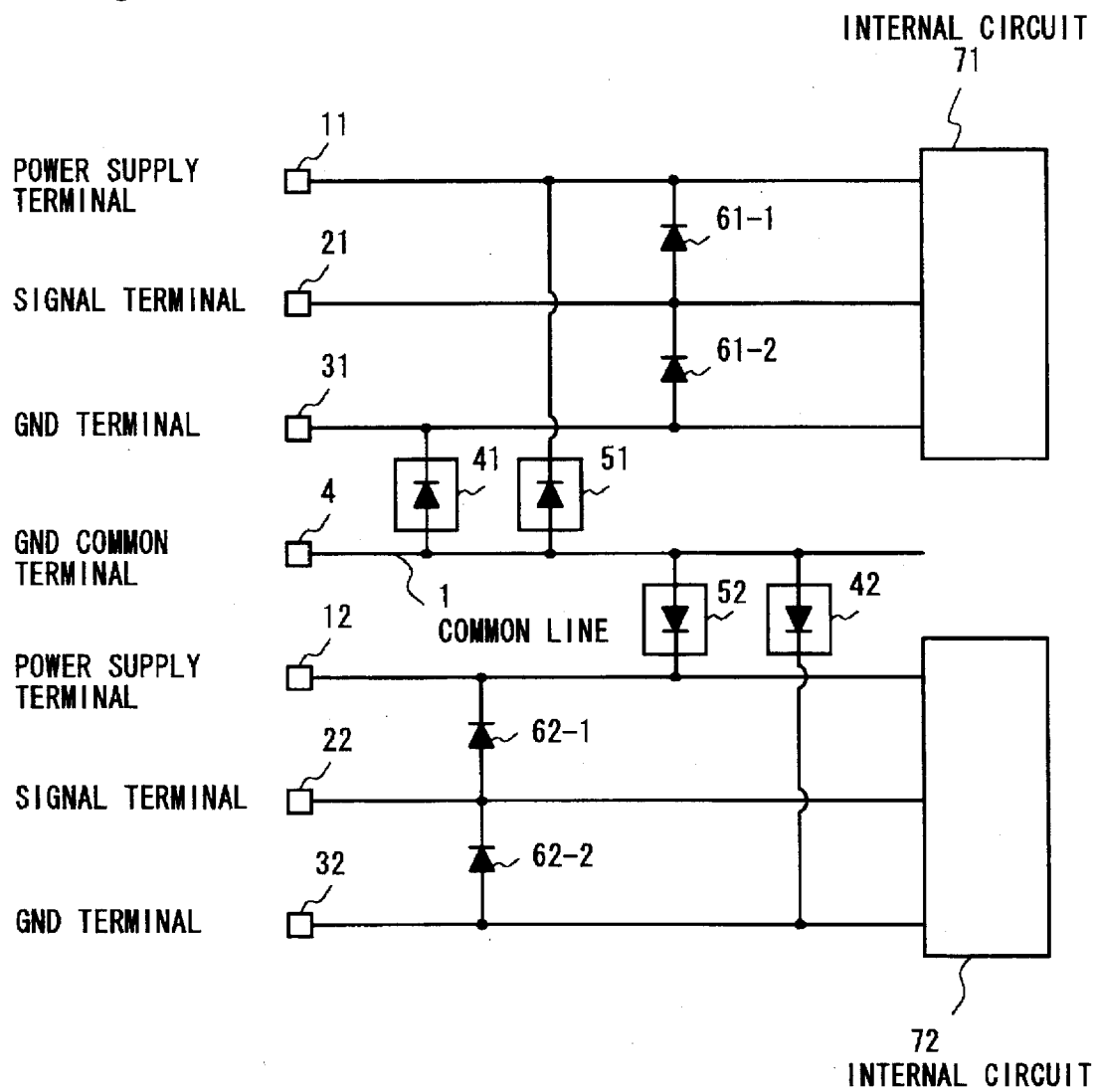
FIG. 4 is a partial circuit diagram of the static electricity protection circuit in the semiconductor integrated circuit shown in FIG. 3.

FIG. 4 is a block diagram of a part of the semiconductor integrated circuit chip of the first embodiment. In FIG. 4, the internal circuit 71 is connected to the higher power supply terminal 11, the lower power supply (ground (GND)) terminal 31 and a signal terminal 21 (not shown in FIG. 3). Diodes 61-1 and 61-2 are connected between the higher power supply line and a signal line connected to the signal terminal 21 and between the signal line and the lower power supply line in the same manner as in the conventional circuit shown in FIG. 2, respectively. Similarly, the internal circuit 72 is connected to the higher power supply terminal 12, the lower power supply terminal 32 and a signal terminal 22 (not shown in FIG. 3). Diodes 62-1 and 62-2 are connected between the higher power supply line and a signal line connected to the signal terminal 22 and between the signal line and the lower power supply line in the same manner as in the conventional circuit shown in FIG. 2, respectively. Further, the higher power supply terminals 11 and 12 are connected to the common line 1 which is connected to the GND common terminal 4, by diodes 51 and 52 in such a manner that the anode of each diode is connected to the common line 1, respectively. Also, the lower power supply terminals 31 and 32 are connected to the common line 1 by diodes 41 and 42 in such a manner that the anode of each diode is connected to the common line 1, respectively. The GND common terminal 4 is set to a predetermined potential, e.g., a potential equal to or lower than the lowest potential of the lower power supply terminals 31 to 35 in this embodiment.

Figure 1:
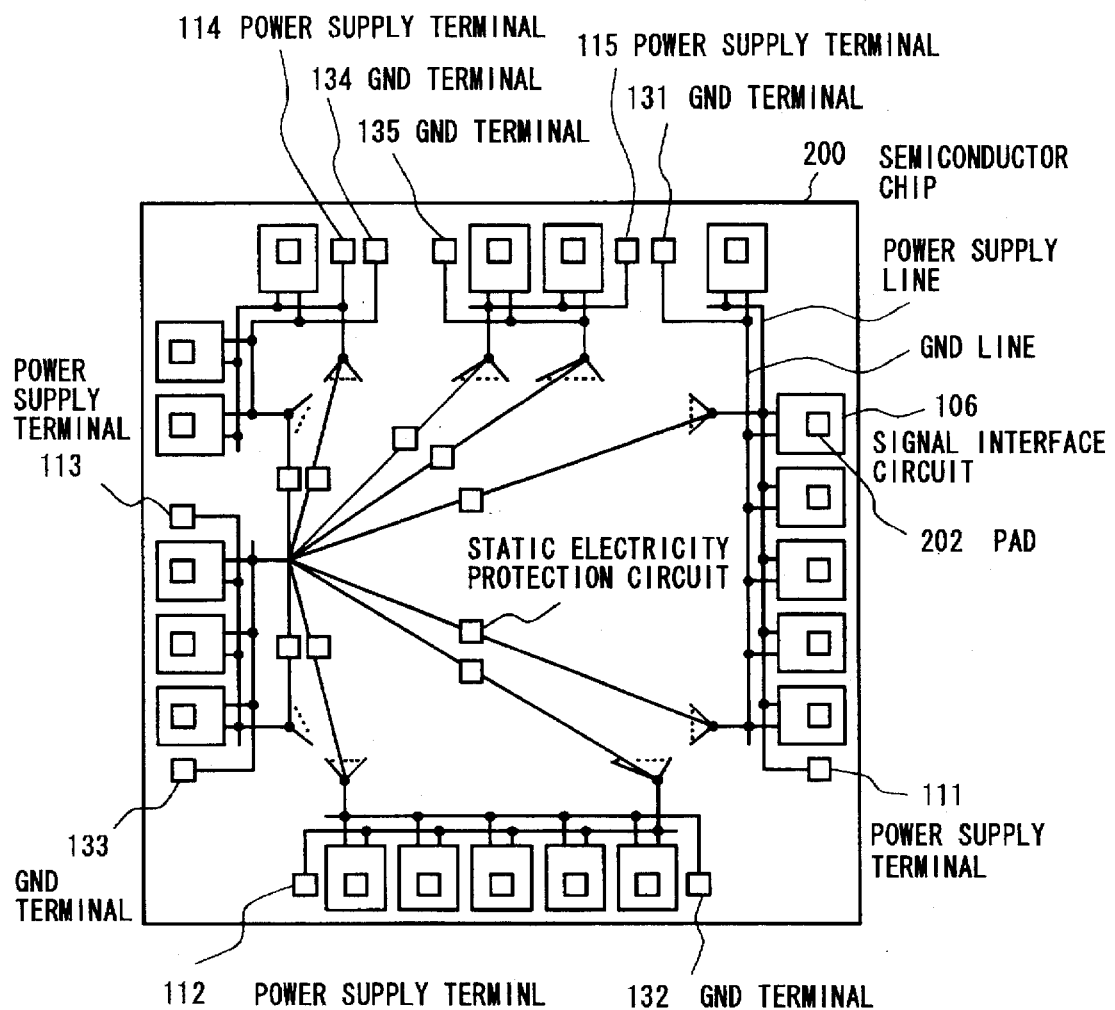
FIG. 1 is a schematic block diagram of a conventional semiconductor integrated circuit in which a plurality of power supply systems and static electricity protection circuits for protecting them from electrostatic destruction are provided.
Figure 2:
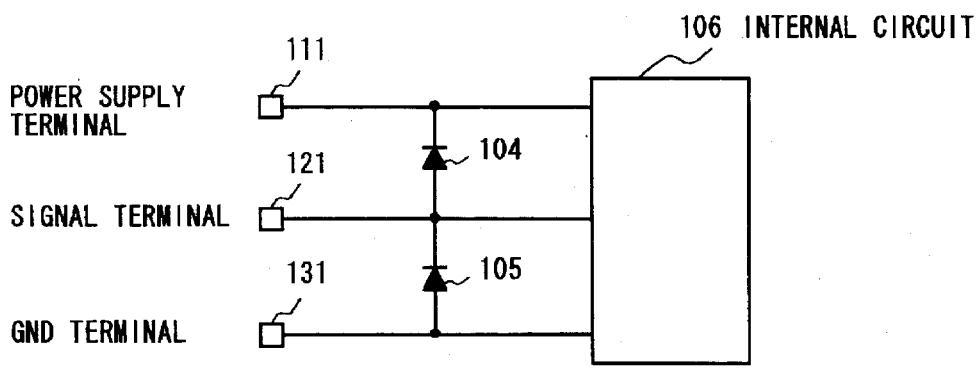
FIG. 2 is a block diagram of a conventional static electricity protection circuit for a single power supply system.

In operation, the relation of the higher power supply terminal, signal terminal and lower power supply (GND) terminal and the internal circuit corresponding to each of the power supply systems is the same as in the conventional circuit shown in FIG. 2. Therefore, description thereof is omitted. When a voltage is generated between the higher power supply terminals 11 and 12 due to static electricity, the internal circuits 71 and 72 are protected from the generated voltage by the diodes 51 and 52. On the other hand, when a voltage is generated between the higher power supply terminal 11 and the lower power supply terminal 32, the internal circuits 71 and 72 are protected from the generated voltage by the diodes 51 and 42. Also, when a voltage is generated between the higher power supply terminal 12 and the lower power supply terminal 31, the internal circuits 71 and 72 are protected from the generated voltage by the diodes 52 and 41. Further, when a voltage is generated between the lower power supply terminals 31 and 32 due to static electricity, the internal circuits 71 and 72 are protected from the generated voltage by the diodes 41 and 42.

Figure 5:
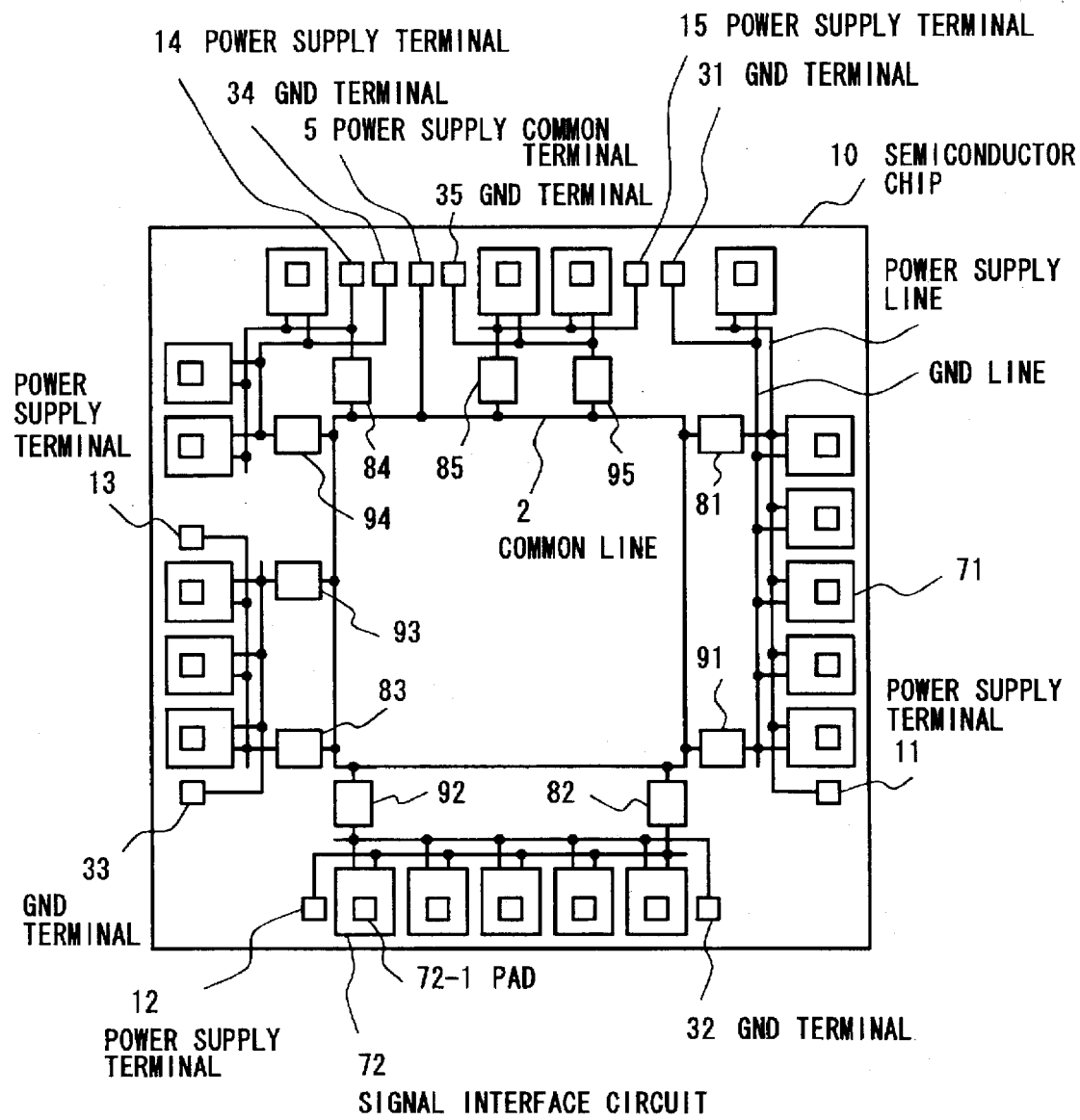
FIG. 5 is a schematic block diagram of a semiconductor integrated circuit according to a second embodiment of the present invention in which a power supply common terminal and a power supply common line are provided so that the number of static electricity protection circuits is reduced compared to the conventional semiconductor integrated circuit.

Next, the static electricity protection circuit according to a second embodiment of the present invention will be described. FIG. 5 is a schematic block diagram of a semiconductor integrated circuit chip 10. Referring to FIG. 5, the internal circuit groups and five power supply systems are the same as those of the first embodiment shown in FIG. 3. Therefore, the description of them is omitted. In this embodiment, at the periphery of the semiconductor chip 10 is provided a power supply common terminal 5 which is connected to a power supply common line 2 provided in the central portion of the semiconductor chip 10 in a ring manner. The higher power supply lines of the five power supply systems are connected to the common line 2 via static electricity protection elements 81, 82, 83, 84 and 85 and the lower power supply lines thereof are connected to the common line 2 by static electricity protection elements 91, 92, 93, 94, and 95. Each of the protection elements includes a diode. Note that a signal line and signal terminal are omitted in the figure for simplification of illustration.

Figure 6:
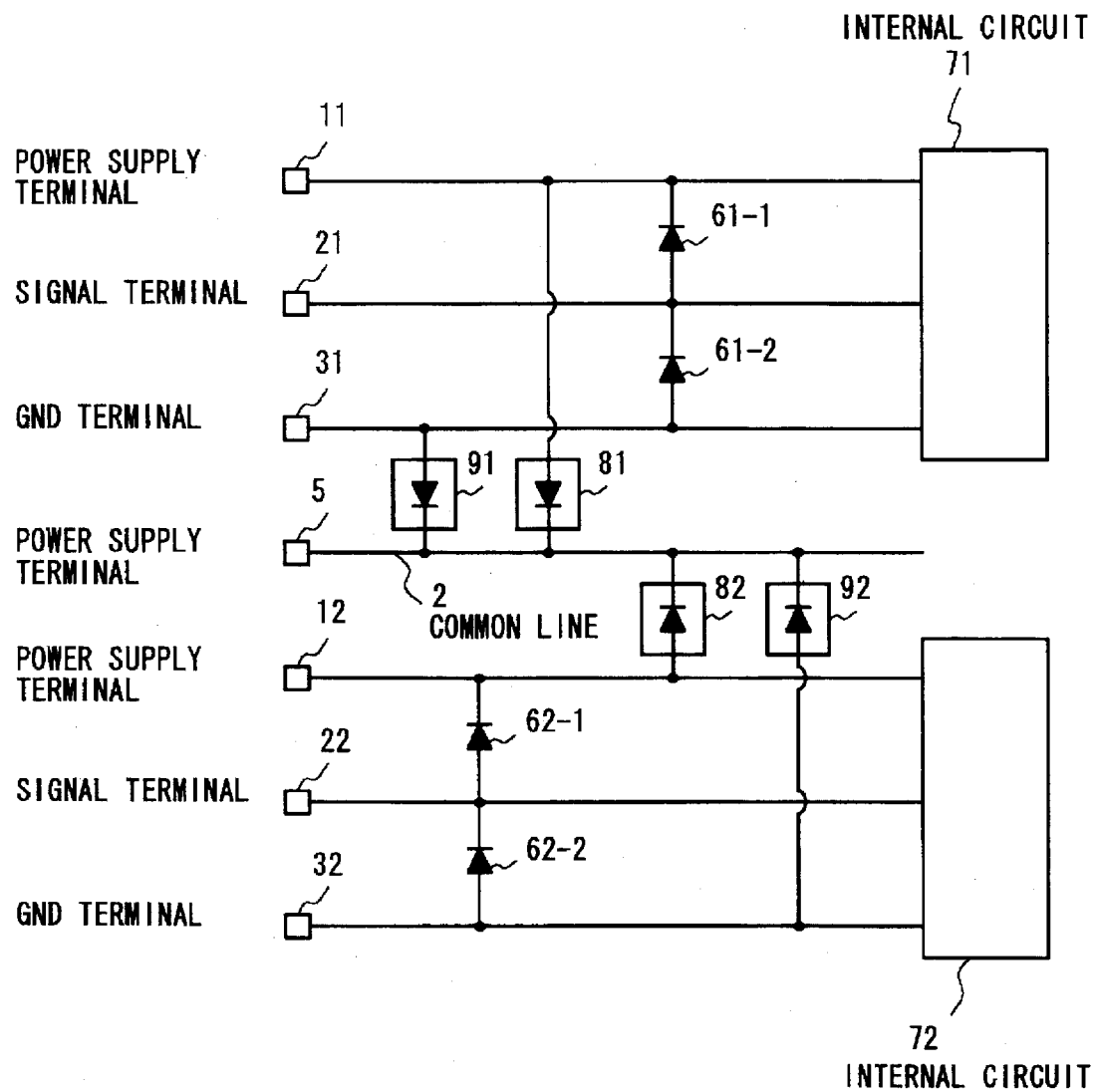
FIG. 6 is a partial circuit diagram of the static electricity protection circuit in the semiconductor integrated circuit shown in FIG. 5.

FIG. 6 is a block diagram of a part of the semiconductor integrated circuit chip of the second embodiment. In FIG. 6, the relation of the higher power supply terminals 11 and 12, signal terminals 21, 22, lower power supply terminals 31, 32, internal circuits 71 and 72 and diodes 61-1, 61-2, 62-1, and 62-2 are the same as in the first embodiment. There is a difference in that the lower power supply terminals 31 and 32 are connected to the common line 2 by diodes 91 and 92 in such a manner that the cathode of each diode is connected to the common line 2, respectively. Also, the higher power supply terminals 11 and 12 are connected to the common line 2 by diodes 81 and 82 in such a manner that the cathode of each diode is connected to the common line 2, respectively. The power supply common terminal 5 is set to a predetermined potential, e.g., a potential equal to or higher than the highest potential of the lower power supply terminals 11 to 15 in this embodiment.

In operation, the relation of the higher power supply terminal, signal terminal and lower power supply (GND) terminal, the internal circuits, and the diodes corresponding to each of the power supply systems is the same as in the conventional circuit shown in FIG. 4. Therefore, description thereof is omitted. When a voltage is generated between the higher power supply terminals 11 and 12 due to static electricity, the internal circuits 71 and 72 are protected from the generated voltage by the diodes 81 and 82. On the other hand, when a voltage is generated between the higher power supply terminal 11 and the lower power supply terminal 32, the internal circuits 71 and 72 are protected from the generated voltage by the diodes 81 and 92. Also, when a voltage is generated between the higher power supply terminal 12 and the lower power supply terminal 31, the internal circuits 71 and 72 are protected from the generated voltage by the diodes 82 and 91. Further, when a voltage is generated between the lower power supply terminals 31 and 32 due to static electricity, the internal circuits 71 and 72 are protected from the generated voltage by the diodes 91 and 92.

Figure 7:
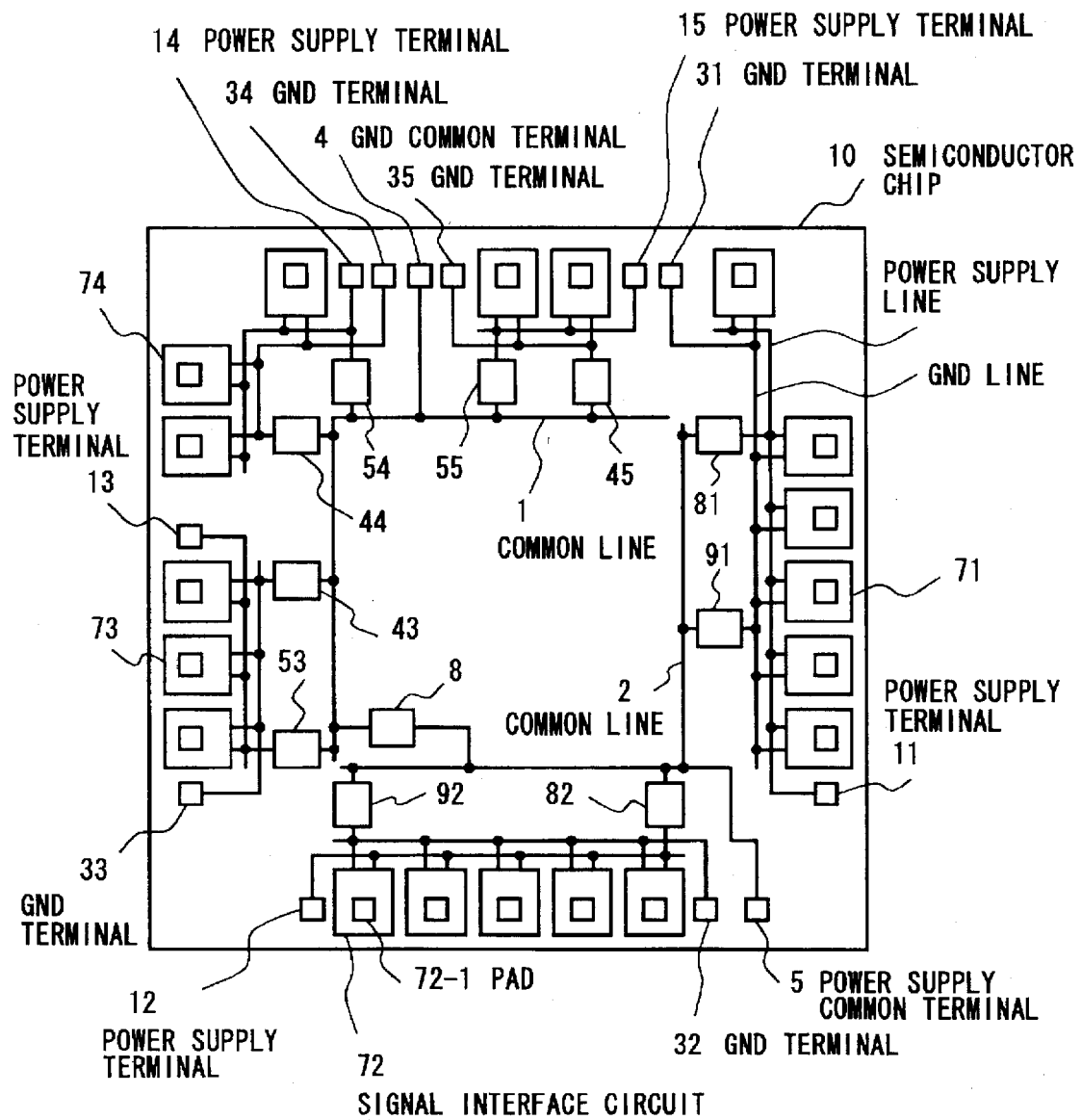
FIG. 7 is a schematic block diagram of a semiconductor integrated circuit according to a third embodiment of the present invention in which two common lines are provided so that the number of static electricity protection circuits is reduced compared to the conventional semiconductor integrated circuit.

Next, the static electricity protection circuit according to a third embodiment of the present invention will be described. The principles of the embodiments shown in FIGS. 3 and 5 are applied to the third embodiment. FIG. 7 is a schematic block diagram of a semiconductor integrated circuit chip 10. Referring to FIG. 7, the internal circuit groups and five power supply systems are the same as those of the first embodiment shown in FIG. 3. The power supply common line 2 and the power supply common terminal 5 are provided for two of the internal circuit groups including the internal circuits 71 and 72 and the GND common line 1 and the GND common terminal 4 are provided for three remaining internal circuit groups including internal circuits 73, 74 and 75. The power supply common line 2 is connected to the GND common line 1 via a static electricity protection element 8 which includes a diode having an anode connected to the GND common line 1.

Figure 8:
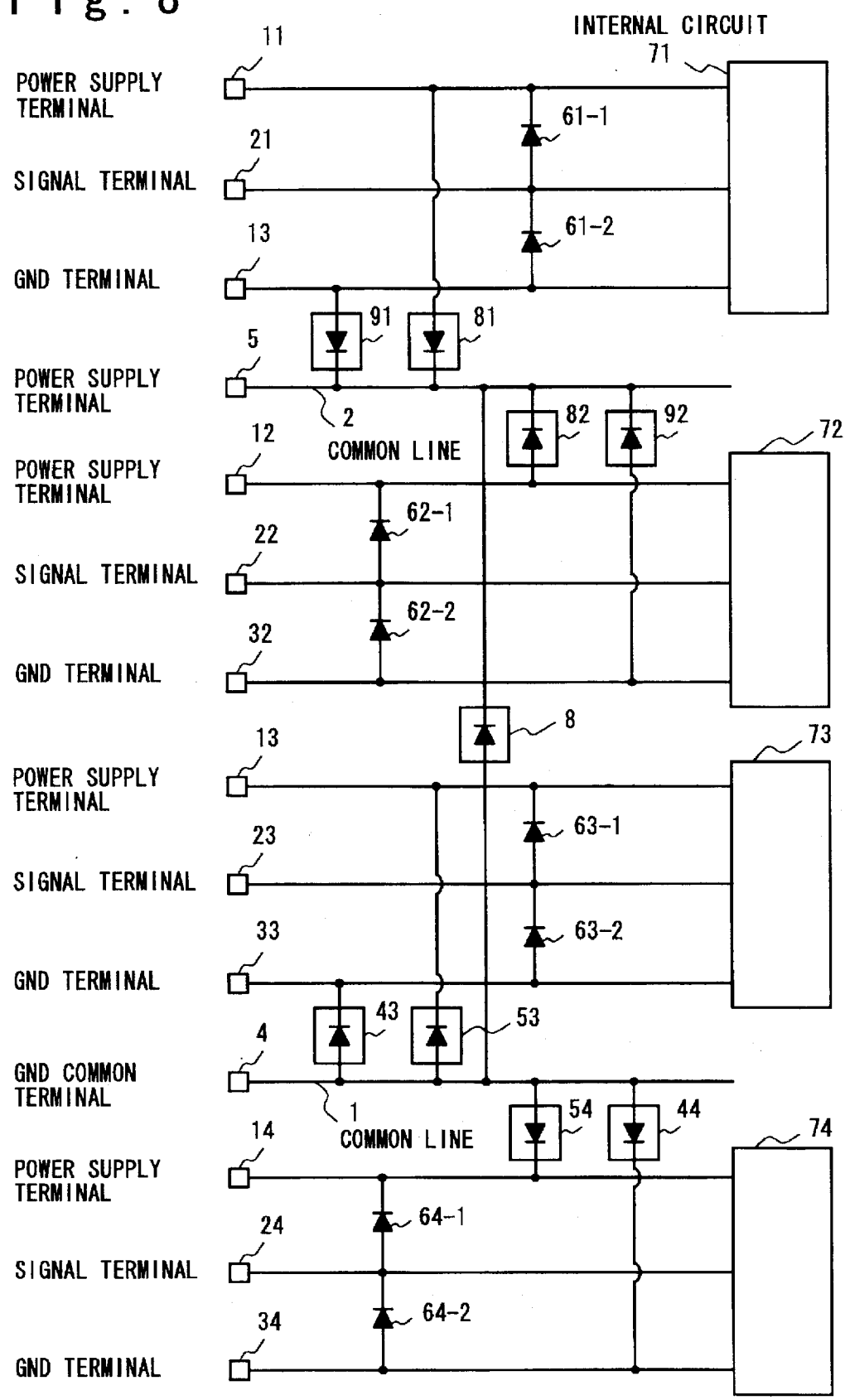
FIG. 8 is a partial circuit diagram of the static electricity protection circuit in the semiconductor integrated circuit shown in FIG. 7.

FIG. 8 is a block diagram of a part of the semiconductor integrated circuit chip of the third embodiment. In FIG. 8, the relation of the higher power supply terminals 11, 12, 13 and 14, signal terminals 21, 22, 23 and 24, lower power supply terminals 31, 32, 33, and 34, internal circuits 71, 72, 73 and 74 and diodes 61-1, 61-2, 62-1, 62-2, 63-1, 63-2, 64-1 and 64-2 are the same as in the first and second embodiments. There is a difference in that the diode 8 is interposed between the power supply common terminal 5 and the GND common terminal 4. The anode of the diode 8 is connected to the GND common terminal 4.

In operation, the principle of static electricity protection for the internal circuits 71 and 72 is the same as that shown in FIG. 3. Also, the principle of static electricity protection for the internal circuits 73, 74 and 75 is the same as that shown in FIG. 5. When a voltage is generated between the power supply system for the internal circuit 71 or 72 and the power supply system for the internal circuit 73, 74 or 75 due to static electricity, the internal circuits are protected by the current path through the protection element 8.

A person skilled in the art could consider various modifications. In the present invention, the common line 1 or 2 is not necessary to be in the form of ring. However, it may have an open portion. The common line is not required to be provided in the central portion of the semiconductor chip. When more than three power supply lines are used in one power supply system, static electricity protection elements may be provided based upon potentials of the power supply lines in normal operation. When a plurality of signal lines are used, two protection elements for each signal line are sufficient to protect the internal circuit to which the signal lines are connected. In the above embodiments, the potential of the common line is set to the potential of the higher power supply line or lower power supply line. This configuration is most preferable. However, the potential of the common line could be set to an arbitrary value. In this case, the orientation of each of the static electricity protection elements or diodes is required to be determined based upon the potential of the common line and the potentials of other lines.

What is claimed is:

1. A semiconductor integrated circuit device comprising:
   a semiconductor integrated circuit including a plurality of circuit sections respectively using different power supply systems; and
   a static electricity protection circuit provided on the same chip as said semiconductor integrated circuit, including:
   a common potential line that is independent from said power supply systems, and static electricity protection elements provided between said common potential line and each of said power supply systems of said plurality of circuit sections.

2. A semiconductor integrated circuit device according to claim 1, wherein said power supply system of each of said plurality of circuit sections includes at least two power supply lines, and wherein one of said static electricity protection elements is provided for each of said at least two power supply lines.

3. A semiconductor integrated circuit device according to claim 2, wherein each of said plurality of circuit sections includes at least one signal line, and said static electricity protection circuit further includes a static electricity protection element provided between said at least one signal line and each of said at least two power supply lines.

4. A semiconductor integrated circuit device according to claim 3, wherein each of said static electricity protection elements is a diode having an orientation determined based upon potentials of two lines to which said diode is connected, such that current does not flow through said diode in absence of a voltage due to static electricity.

5. A semiconductor integrated circuit device according to claim 1, wherein said common potential line is set to a predetermined potential level.

6. A semiconductor integrated circuit device according to claim 5, wherein said commnon potential line is set to a potential equal to or higher than highest potential of said power supply systems.

7. A semiconductor integrated circuit device according to claim 5, wherein said commnon potential line is set to a potential equal to or lower than lowest potential of said power supply systems.

8. A semiconductor integrated circuit device comprising:
a semiconductor integrated circuit including a plurality of circuit sections respectively using different power supply systems; and
a static electricity protection circuit provided on the same chip as said semiconductor integrated circuit, including:
two common potential lines that are independent from said power supply systems of said plurality of circuit sections, and
static electricity protection elements provided between said common potential lines and each of said power supply systems of said plurality of circuit sections.

9. A semiconductor integrated circuit device according to claim 8, wherein said power supply system of each of said plurality of circuit sections includes at least two power supply lines, and wherein a respective one of said static electricity protection elements is provided between each of said at least two power supply lines, and a static electricity protection element is provided between said two common potential lines.

10. A semiconductor integrated circuit device according to claim 9, wherein each of said plurality of circuit sections includes at least one signal line, and said static electricity protection circuit further includes static electricity protection elements provided between said at least one signal line and each of said at least two power supply lines.

11. A semiconductor integrated circuit device according to claim 10, wherein each of said static electricity protection elements is a diode having an orientation determined based upon potentials of two lines to which said diode is connected, such that current does not flow through said diode in absence of a voltage due to static electricity.

12. A semiconductor integrated circuit device according to claim 8, wherein said common potential lines are set to different predetermined potential levels.

13. A semiconductor integrated circuit device according to claim 12, wherein one of said common potential lines is set to a potential equal to or higher than highest potential of said power supply systems and the other common potential line is set to a potential equal to or lower than lowest potential of said power supply systems.

14. A semiconductor integrated circuit device comprising:
a plurality of power supply systems, each of which systems includes at least two power supply lines; and
a static electricity protection section including at least one common line which is independent from said plurality of power supply systems and connected to said plurality of power supply systems via a plurality of static electricity protection elements, and enabling current due to static electricity to flow between said plurality of power supply systems via said at least one common line and said plurality of protection elements.

15. A semiconductor integrated circuit device according to claim 14, wherein said plurality of static electricity protection elements are provided between said common potential line and said power supply lines of said plurality of power supply systems.

16. A semiconductor integrated circuit device according to claim 15, wherein said common potential line is set to a predetermined potential level.

17. A semiconductor integrated circuit device according to claim 16, wherein said commnon potential line is set to a potential equal to or higher than highest potential of said power supply systems.

18. A semiconductor integrated circuit device according to claim 16, wherein said commnon potential line is set to a potential equal to or lower than lowest potential of said power supply systems.

19. A semiconductor integrated circuit device according to claim 14, wherein said static electricity protection section includes two common potential lines set to different potentials, and said static electricity protection elements are provided between said two common potential lines and said power supply lines of said plurality of circuit sections.

20. A semiconductor integrated circuit device according to claim 19, wherein one of said two common potential lines is set to a potential equal to or higher than highest potential of said power supply systems and the other of said two common potential lines is set to a potential equal to or lower than lowest potential of said power supply systems.

* * * * *

UNITED STATES PATENT AND TRADEMARK OFFICE
CERTIFICATE OF CORRECTION

PATENT NO. : 5,693,973
DATED : December 2, 1997
INVENTOR(S) : Fumio Nakano & Katsuhiko Higashino It is certified that error appears in the above-identified patent and that said Letters Patent is hereby corrected as shown below:

Claim 3, Col. 7, line 14, insert --one-- after "lease".

Claim 6, Col. 7, line 26, please change "commnon" to --common--.

Claim 7, Col. 7, line 30, please change "commnon" to --common--.

Claim 17, Col. 8, line 37, please change "commnon" to --common--.

Claim 18, Col. 8, line 41, please change "commnon" to --common--.

Signed and Sealed this

Twentieth Day of October, 1998

*Attest:*

BRUCE LEHMAN

*Attesting Officer*    Commissioner of Patents and Trademarks